(12) United States Patent
Kinoshita

(10) Patent No.: US 12,520,551 B2
(45) Date of Patent: Jan. 6, 2026

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 393 days.

(21) Appl. No.: 18/342,372

(22) Filed: Jun. 27, 2023

(65) Prior Publication Data
US 2024/0063269 A1    Feb. 22, 2024

(30) Foreign Application Priority Data
Aug. 19, 2022    (JP) ................ 2022-131337

(51) Int. Cl.
| | |
|---|---|
| *H10D 62/832* | (2025.01) |
| *H10D 8/01* | (2025.01) |
| *H10D 30/66* | (2025.01) |
| *H10D 62/10* | (2025.01) |
| *H10D 62/13* | (2025.01) |

(52) U.S. Cl.
CPC ......... *H10D 62/8325* (2025.01); *H10D 8/021* (2025.01); *H10D 30/668* (2025.01); *H10D 62/127* (2025.01); *H10D 62/157* (2025.01)

(58) Field of Classification Search
CPC ............ H10D 62/8325; H10D 62/157; H10D 62/127; H10D 8/021; H10D 30/668

USPC .......................................... 257/77
See application file for complete search history.

(56) References Cited

U.S. PATENT DOCUMENTS

| | | |
|---|---|---|
| 2009/0261350 A1 | 10/2009 | Yamamoto et al. |
| 2012/0183995 A1* | 7/2012 | Ferrari ............ C12N 9/54 |
| | | 435/219 |
| 2018/0138264 A1 | 5/2018 | Kinoshita |
| 2019/0181261 A1* | 6/2019 | Okumura ........ H10D 62/105 |

(Continued)

FOREIGN PATENT DOCUMENTS

| | | |
|---|---|---|
| JP | 4640439 B2 | 3/2011 |
| JP | 2020-120072 A | 8/2020 |

(Continued)

*Primary Examiner* — Igwe U Anya
(74) *Attorney, Agent, or Firm* — Rabin & Berdo, P.C.

(57) ABSTRACT

A silicon carbide semiconductor device has a silicon carbide semiconductor substrate of a first conductivity type; a first semiconductor layer of the first conductivity type; a second semiconductor layer of a second conductivity type; first semiconductor regions of the first conductivity type; trenches; gate insulating films; gate electrodes; first high-concentration regions of the second conductivity type provided at positions facing the trenches in a depth direction; second high-concentration regions of the second conductivity type, selectively provided between the trenches and in contact with the first semiconductor regions, each having an upper surface exposed at the surface of the second semiconductor layer and a lower surface partially in contact with upper surfaces of the first high-concentration regions; a first electrode; and a second electrode. The second high-concentration regions are disposed periodically in a longitudinal direction of the trenches.

8 Claims, 14 Drawing Sheets

(56) References Cited

U.S. PATENT DOCUMENTS

| | | |
|---|---|---|
| 2020/0119147 A1* | 4/2020 | Kinoshita ............ H10D 62/157 |
| 2020/0243404 A1 | 7/2020 | Kaji et al. |
| 2023/0092965 A1 | 3/2023 | Narita |

FOREIGN PATENT DOCUMENTS

| | | |
|---|---|---|
| JP | 6848382 B2 | 3/2021 |
| WO | 2022/137789 A1 | 6/2022 |

\* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2022-131337, filed on Aug. 19, 2022, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is expected to replace silicon (Si) as a next-generation semiconductor material. Compared to a conventional semiconductor device element that uses silicon as a semiconductor material, a semiconductor device that uses silicon carbide as a semiconductor material (hereinafter, silicon carbide semiconductor device) has various advantages such as enabling resistance of a device in an ON state to be reduced to a few hundredths and application under higher temperature (200 degrees C. or higher) environments. These advantages are due to characteristics of the material itself in that a bandgap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A planar gate structure is a MOS gate structure in which a MOS gate is provided in a flat plate-like shape on a front surface of a semiconductor substrate. A trench gate structure is a MOS gate structure in which a MOS gate is embedded in a trench formed in a semiconductor substrate (semiconductor chip), at a front surface thereof and a channel (inversion layer) is formed along a sidewall of the trench in a direction orthogonal to the front surface of the semiconductor substrate. Therefore, compared to the planar gate structure in which a channel is formed along the front surface of the semiconductor substrate, unit cell (constituent unit of device element) density per unit area as well as current density per unit area may be increased, which are advantageous in terms of cost.

FIG. 14 is a cross-sectional view of a structure of a conventional silicon carbide semiconductor device along cutting line A-A' in FIG. 16. FIG. 15 is a cross-sectional view of the structure of the conventional silicon carbide semiconductor device along cutting line B-B' in FIG. 16. FIG. 16 is a plan view depicting the structure of the conventional silicon carbide semiconductor device. A conventional silicon carbide semiconductor device 110 depicted in FIGS. 14 and 15 is a vertical MOSFET having a trench gate structure on a semiconductor substrate (semiconductor chip) 140 that contains silicon carbide. In FIGS. 14 and 15, only an active region is depicted while an edge termination region is not depicted.

The semiconductor substrate 140 is formed by epitaxially growing, on a front surface of an $n^+$-type starting substrate 141 that contains silicon carbide, an $n^-$-type silicon carbide layer 142 that constitutes an $n^-$-type drift region 112. The semiconductor substrate 140 has, as a front surface, a main surface that has the $n^-$-type silicon carbide layer 142 and has, as a back surface, a main surface that has the $n^+$-type starting substrate 141. In an entire area of the back surface of the semiconductor substrate 140 (the back surface of the $n^+$-type starting substrate 141), a drain electrode 145 is provided. The $n^+$-type starting substrate 141 constitutes an $n^+$-type drain region 111.

At a first surface of the $n^-$-type drift region 112, opposite to a second surface thereof facing an $n^+$-type silicon carbide substrate 111, an n-type current spreading region 120 is provided. In the n-type current spreading region 120, at the surface thereof, $p^+$-type regions 122, each configured by a lower portion of 123 of a $p^+$-type region and an upper portion 124 of a $p^+$-type region, are selectively provided between trenches 116. Further, in the n-type current spreading region 120, $p^+$-type regions 121 are selectively provided at positions facing bottoms of the trenches 116 in a depth direction. MOS gates of the trench gate structure are configured by p-type base regions 113, $n^+$-type source regions 114, $p^{++}$-type contact regions 115, the trenches 116, gate insulating films 117, and gate electrodes 118.

Further, an interlayer insulating film 119 is provided on the gate electrodes 118 and ohmic electrodes 143 that are in contact with the $n^+$-type source regions 114 and the $p^{++}$-type contact regions 115 are provided in openings of the interlayer insulating film 119. On the ohmic electrodes 143 and the interlayer insulating film 119, a barrier metal 138 that prevents diffusion of metal to from the gate electrodes 118 is provided. On the barrier metal 138, a source electrode 144 is provided.

The $p^+$-type regions 121, 122 are fixed to the potential of the source electrode 144, deplete (or cause the n-type current spreading region 120 to deplete, or both) when the MOSFET (the silicon carbide semiconductor device 110) is off and thus, have a function of mitigating electric field applied to the gate insulating films 117 beneath the trenches 116. The $p^+$-type regions 121 are provided apart from the p-type base regions 113 and face the bottoms of the trenches 116 in the depth direction. As a result, the $p^+$-type regions 121 create a deep p-type structure beneath the $p^{++}$-type contact regions 115, at positions apart from the trenches 116 and prevent current from flowing beneath the trenches 116 when avalanche occurs so that the potential beneath the trenches 116 does not rise. Further, as depicted in FIG. 16, periodically in a longitudinal direction, the $p^+$-type regions 121 are continuous with $p^+$-type regions 123 and are thereby electrically connected to the source electrode 144. FIG. 14 is a cross-sectional view of a portion where the $p^+$-type regions 121 and the $p^+$-type regions 123 are apart from one another while FIG. 15 is a cross-sectional view of a portion where the $p^+$-type regions 121 and the $p^+$-type regions 123 are continuous with each other. The $p^+$-type regions 122, at upper surfaces thereof, are in contact with the p-type base regions 113 and are electrically connected to the source electrode 144 via the p-type base regions 113.

Further, in a commonly known semiconductor device, an electric field block layer that is orthogonal to the trench is provided beneath a trench and the electric field block layer is electrically connected to a p-type base region by a p-type deep layer (for example, refer to Japanese Laid-Open Patent Publication No. 2020-120072). Further, in a commonly known semiconductor device, multiple linear-shaped p-type deep layers extending in a first direction that is 45 degrees with respect to a longitudinal direction of a trench are arranged at equal intervals beneath the trench; and multiple linear-shaped p-type deep layers extending in a second direction, which is 45 degrees with respect to the longitudinal direction of the trench and orthogonal to the first direction, are arranged at equal intervals and are electrically connected to the p-type base regions (for example, refer to Japanese Patent No. 4640439). Further, another commonly known semiconductor device has trenches provided in a striped pattern in a plane view of the semiconductor device and base regions that are provided periodically in a direction parallel to the trenches, while at bottoms of the trenches, a portion of each of the base regions extends in a direction parallel to the trenches, whereby the base regions are connected to one another (for example, refer to Japanese Patent No. 6848382). Further, another commonly known semiconductor device has a carrier transport layer of a first conductivity type; an injection control region of a second conductivity type, provided at an upper surface of the carrier transport layer; a carrier supply region of the first conductivity type, provided in an upper portion of the injection control region; a base contact region of the second conductivity type, provided in the upper portion of the injection control region; trenches that penetrate through the injection control region and reach the carrier transport layer; upper embedded regions of the second conductivity type, in contact with a lower surface of the injection control region; and lower embedded regions of the second conductivity type, in contact with lower surfaces of the upper embedded regions and bottoms of the trenches; between the trenches, the lower side embedded regions are apart from one another with the carrier transport layer intervening therebetween (for example, refer to International Publication No. WO 2022/137789).

SUMMARY OF THE INVENTION

According to an embodiment of the present invention, a silicon carbide semiconductor device includes: a silicon carbide semiconductor substrate of a first conductivity type, having a first main surface and a second main surface opposite to each other; a first semiconductor layer of the first conductivity type, provided at the first main surface of the silicon carbide semiconductor substrate, the first semiconductor layer having an impurity concentration that is lower than an impurity concentration of the silicon carbide semiconductor substrate, the first semiconductor layer having a first surface and a second surface opposite to each other, the second surface facing the silicon carbide semiconductor substrate; a second semiconductor layer of a second conductivity type, provided at the first surface of the first semiconductor layer, the second semiconductor layer having a first surface and a second surface opposite to each other, the second surface facing the first semiconductor layer; a plurality of first semiconductor regions of the first conductivity type, selectively provided in the second semiconductor layer at the first surface thereof; a plurality of trenches penetrating through respective ones of the plurality of first semiconductor regions and the second semiconductor layer and reaching the first semiconductor layer; a plurality of gate electrodes, each provided in a corresponding one of the plurality of trenches, via a gate insulating film; a plurality of first high-concentration regions of the second conductivity type provided in the first semiconductor layer at positions facing respective ones of the plurality of trenches in a depth direction of the silicon carbide semiconductor device; a plurality of second high-concentration regions of the second conductivity type, each selectively provided in the second semiconductor layer and the first semiconductor layer between a corresponding adjacent two of the plurality of trenches, each of the plurality of second high-concentration regions being in contact with a corresponding one the plurality of first semiconductor regions, each of the plurality of second high-concentration regions having an upper surface exposed from the first surface of the second semiconductor layer and a lower surface partially in contact with upper surfaces of a corresponding adjacent two of the plurality of first high-concentration regions; a first electrode provided on surfaces of the plurality of second high-concentration regions and the plurality of first semiconductor regions; and a second electrode provided on the second main surface of the silicon carbide semiconductor substrate. The plurality of second high-concentration regions is disposed periodically in a longitudinal direction of the trenches.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
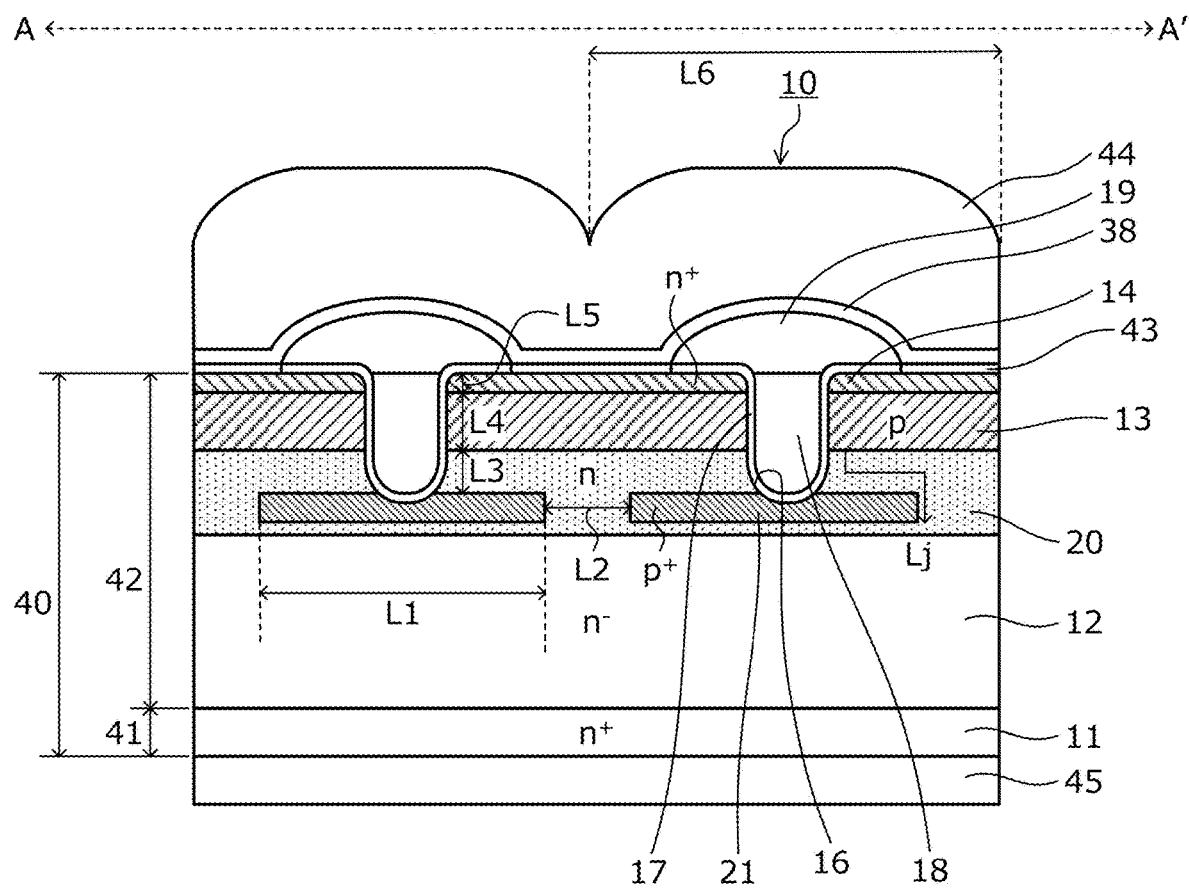
FIG. 1 is a cross-sectional view along cutting line A-A' in FIG. 3A depicting a structure of a silicon carbide semiconductor device according to a first embodiment.

First, problems associated with the conventional techniques are discussed. In the structure of the conventional silicon carbide semiconductor device, there are many structures per cell and thus, shortening of the cell pitch is difficult. Therefore, reduction of resistance is difficult in a case of SiC for which channel mobility is particularly low. Further, a problem arises in that because the structure is complicated, p-type regions of the pn junction portions are thin, whereby concentration of electric field tends to easily occur and breakdown voltage decreases.

On the other hand, when the number of connections between the $p^+$-type regions 121 and the $p^+$-type regions 122 in a longitudinal direction is decreased to reduce resistance, at the $p^+$-type regions 121 beneath the trenches 116, there are portions that are far from the $p^{++}$-type contact regions 115, which are connected to the source electrode 144, and when operation is performed by passing a large current through built-in pn diodes, a large load may be placed on the gate insulating films 117.

Embodiments of a silicon carbide semiconductor device and a method of manufacturing a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without+ or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 2:
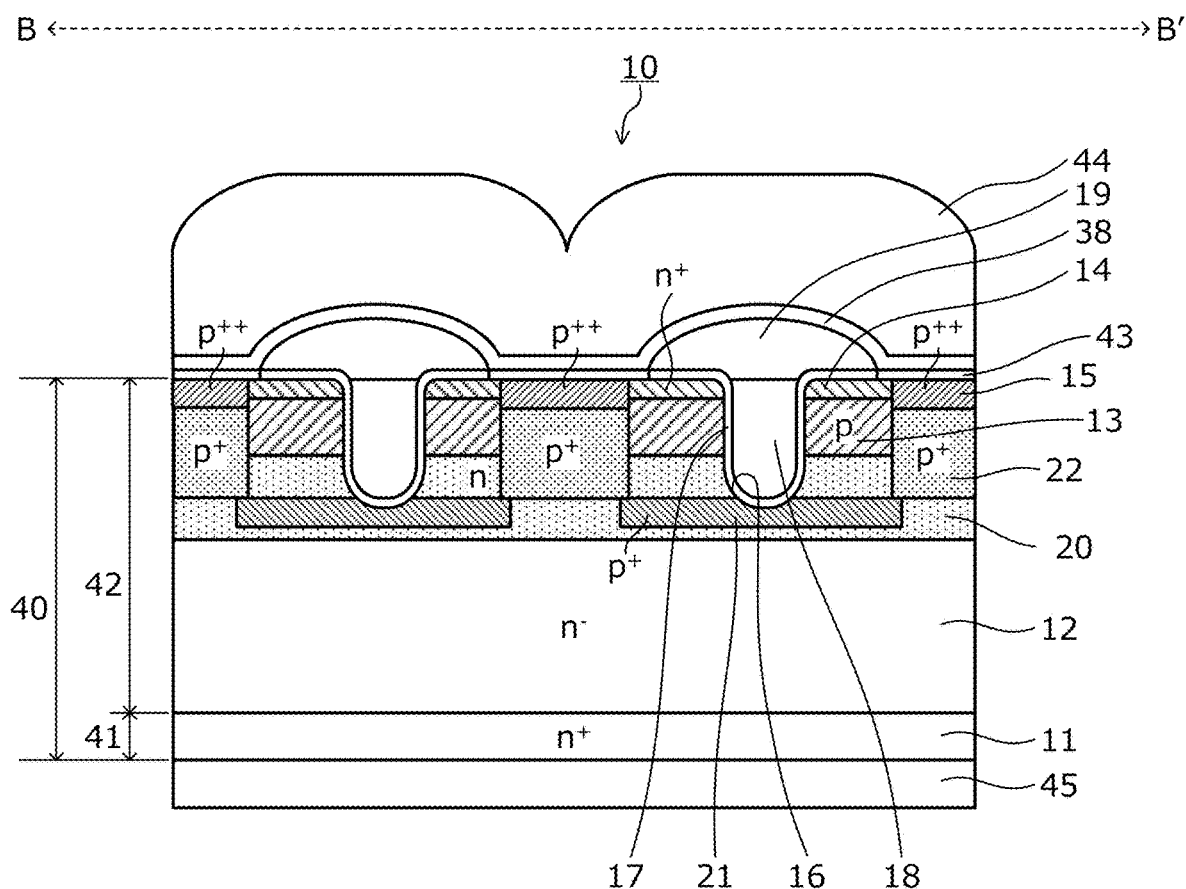
FIG. 2 is cross-sectional view along cutting line B-B' in FIG. 3A depicting the structure of the silicon carbide semiconductor device according to the first embodiment.
Figure 3A:
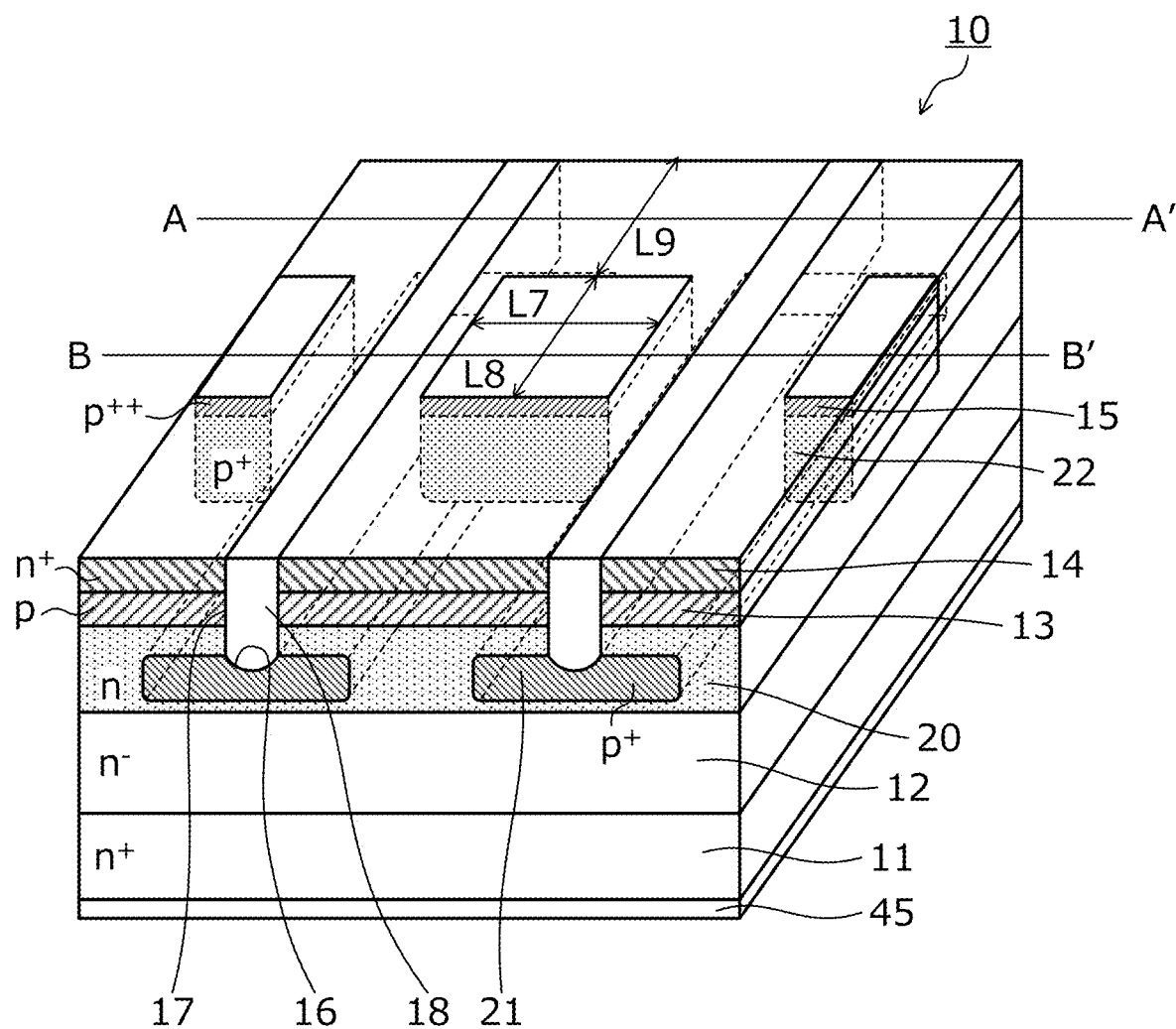
FIG. 3A is a perspective view depicting the structure of the silicon carbide semiconductor device according to the first embodiment.

A structure of a silicon carbide semiconductor device according to a first embodiment is described. FIG. 1 is a cross-sectional view along cutting line A-A' in FIG. 3A depicting the structure of the silicon carbide semiconductor device according to the first embodiment. FIG. 2 is cross-sectional view along cutting line B-B' in FIG. 3A depicting the structure of the silicon carbide semiconductor device according to the first embodiment. FIG. 3A is a perspective view depicting the structure of the silicon carbide semiconductor device according to the first embodiment. A silicon carbide semiconductor device 10 according to the first embodiment depicted in FIGS. 1 to 3A is a vertical MOS-FET having a trench gate structure in a semiconductor substrate (semiconductor chip) 40 that contains silicon carbide (SiC).

In FIGS. 1 to 3A, only an active region through which current flows during an on-state is depicted while an edge termination region that surrounds a periphery of the active region and in which a voltage withstanding structure is provided is not depicted. The voltage withstanding structure has a function of mitigating electric field close to a border between the active region and the edge termination region and sustaining breakdown voltage. The breakdown voltage is a voltage limit at which voltage between a drain and source does not further increase even when current between the drain and source increases due to an occurrence of avalanche breakdown by a pn junction.

In the semiconductor substrate 40, multiple unit cells (functional units of the device) each having the same MOSFET structure are disposed adjacent to one another. The semiconductor substrate 40 is formed by epitaxially growing, on a front surface of an $n^+$-type starting substrate (silicon carbide semiconductor substrate of a first conductivity type) 41 that contains silicon carbide, an $n^−$-type silicon carbide layer 42 that constitutes an $n^−$-type drift region (first semiconductor layer of the first conductivity type) 12. The semiconductor substrate 40 has, as a front surface (first main surface), a main surface having the $n^−$-type silicon carbide layer 42 and has, as a back surface (second main surface), a main surface having the $n^+$-type starting substrate 41.

The $n^+$-type starting substrate 41 constitutes an $n^+$-type drain region 11. The semiconductor substrate 40 is formed by sequential multistage epitaxial growth of the $n^−$-type silicon carbide layer 42 that constitutes the $n^−$-type drift region 12, when portions of the active region are formed. The $n^−$-type drift region 12 is a portion of the $n^−$-type silicon carbide layer 42, free of diffused regions forming by ion implantation and left having the same impurity concentration as that at the time of the epitaxial growth. The $n^−$-type drift region 12 is in contact with the $n^+$-type starting substrate 41 and provided spanning an entire area from the active region to a chip end. The $n^−$-type silicon carbide layer 42 may be formed by a single stage of epitaxial growth while p-type base regions 13, $n^+$-type source regions 14, $p^{++}$-type contact regions 15, an n-type current spreading region 20, and $p^+$-type regions 21, 22 are formed by ion implantation.

In the active region of the first embodiment, a trench gate structure is provided. The trench gate structure is configured by the p-type base regions (second semiconductor layer of the second conductivity type) 13, the $n^+$-type source regions (first semiconductor regions of the first conductivity type) 14, the $p^{++}$-type contact regions (second high-concentration regions of the second conductivity type, upper second high-concentration regions) 15, trenches 16, gate insulating films 17, and gate electrodes 18. The p-type base regions 13, the $n^+$-type source regions 14, and the $p^{++}$-type contact regions 15 are diffused regions formed in the $n^−$-type silicon carbide layer 42 by ion implantation. The p-type base regions 13 are provided in an entire area between the front surface of the semiconductor substrate 40 and the $n^−$-type drift region 12.

The $n^+$-type source regions 14 and the $p^{++}$-type contact regions 15 are each selectively provided between the front surface of the semiconductor substrate 40 and the p-type base regions 13 and respective bottoms (lower surfaces: ends facing the back surface of the semiconductor substrate 40) thereof are in contact with the p-type base regions 13. The $n^+$-type source regions 14 are provided in contact with the $p^{++}$-type contact regions 15. The $n^+$-type source regions 14 and the p$^{++}$-type contact regions 15, at respective upper surfaces (ends facing the front surface of the semiconductor substrate 40) thereof, are in ohmic contact with ohmic electrodes 43.

Between the n$^-$-type drift region 12 and the p-type base regions 13, at deep positions closer to the n$^+$-type drain region 11 (the back surface of the semiconductor substrate 40) than are bottoms of the trenches 16, the n-type current spreading region 20, the p$^+$-type regions (first high-concentration regions of the second conductivity type) 21, and the p$^+$-type regions (second high-concentration regions of the second conductivity type, lower second high-concentration regions) 22 are each selectively provided. The n-type current spreading region 20 and the p$^+$-type regions 21, 22 are diffused regions formed in the n$^-$-type silicon carbide layer 42 by ion implantation. Preferably, the n-type current spreading region 20 may reach a deep position closer to the n$^+$-type drain region 11 than are the p$^+$-type regions 21, 22.

The n-type current spreading region 20 is a so-called current spreading layer (CSL) that reduces carrier spreading resistance. The n-type current spreading region 20 is between and in contact with the p$^+$-type regions 21, 22 and extends in a direction parallel to the front surface of the semiconductor substrate 40, reaches the trenches 16, and is in contact with the gate insulating films 17. The n-type current spreading region 20, at an upper surface thereof, is in contact with the p-type base regions 13 and at a bottom thereof, is in contact with the n$^-$-type drift region 12.

The n-type current spreading region 20 may be omitted. In an instance in which the n-type current spreading region 20 is omitted, instead of the n-type current spreading region 20, the n$^-$-type drift region 12 reaches the p-type base regions 13, is in contact with the p-type base regions 13 and the p$^+$-type regions 21, 22, reaches the trenches 16 in a direction parallel to the front surface of the semiconductor substrate 40, and is in contact with the gate insulating films 17.

The p$^+$-type regions 21, 22 are fixed to the potential of a later-described source electrode 44 and have a function of mitigating electric field applied to the gate insulating films 17 by depleting (or causing the n-type current spreading region 20 to deplete, or both) when the MOSFET (the silicon carbide semiconductor device 10) is off. The p$^+$-type regions 21 are provided apart from the p-type base regions 13 and face the bottoms of the trenches 16 in the depth direction. The p$^+$-type regions 21 are partially continuous with the p$^+$-type regions 22 and are thereby electrically connected to the source electrode 44. FIG. 1 depicts a cross-sectional view of a portion that is free of the p$^+$-type regions 2 while FIG. 2 is a cross-sectional view depicting a portion in which the p$^+$-type regions 22 are provided and where the p$^+$-type regions 22 and the p$^+$-type regions 21 are partially continuous.

The p$^+$-type regions 21 may be in contact with the gate insulating films 17 at the bottoms of the trenches 16 or may be apart from the bottoms of the trenches 16. A width of each of the p$^+$-type regions 21 is equal to a width of each of the trenches 16 or wider than the width of each of the trenches 16. For example, preferably, the width of each of the p$^+$-type regions 21 may be two times the width of each of the trenches 16 or greater. When the width of each of the p$^+$-type regions 21 is wider than the width of each of the trenches 16, the p$^+$-type regions 21 further face bottom corner portions (border between sidewalls and the bottom) of the trenches 16 in the depth direction. As a result, the electric field mitigating effect close to the bottoms of the trenches 16 by the p$^+$-type regions 21 is increased.

The p$^+$-type regions 22 are regions that connect the p$^+$-type regions 21 and the p$^{++}$-type contact regions 15 to one another, are provided centered between any adjacent two of the trenches 16, and are apart from the trenches 16. The p$^+$-type regions 22, at upper surfaces thereof, are in contact with the p$^{++}$-type contact regions 15 and are electrically connected to the source electrode 44 via the p$^{++}$-type contact regions 15. The p$^+$-type regions 22 are provided for connection and thus, may have an impurity concentration that is lower than an impurity concentration of the p$^+$-type regions 21.

Each of the p$^+$-type regions 22 has a width that is equal to a width of each of the p$^{++}$-type contact regions 15. A depth of each of the p$^+$-type regions 22 is shallower than a depth of the p$^+$-type regions 21 and a lower surface of each of the p$^+$-type regions 22 is at a same depth as that of an upper surface (end facing the front surface of the semiconductor substrate 40) of each of the p$^+$-type regions 21 while a lower surface (end facing the back surface of the semiconductor substrate 40) of each of the p$^+$-type regions 22 is in contact with a portion of the upper surfaces of the p$^+$-type regions 21.

Figure 14:
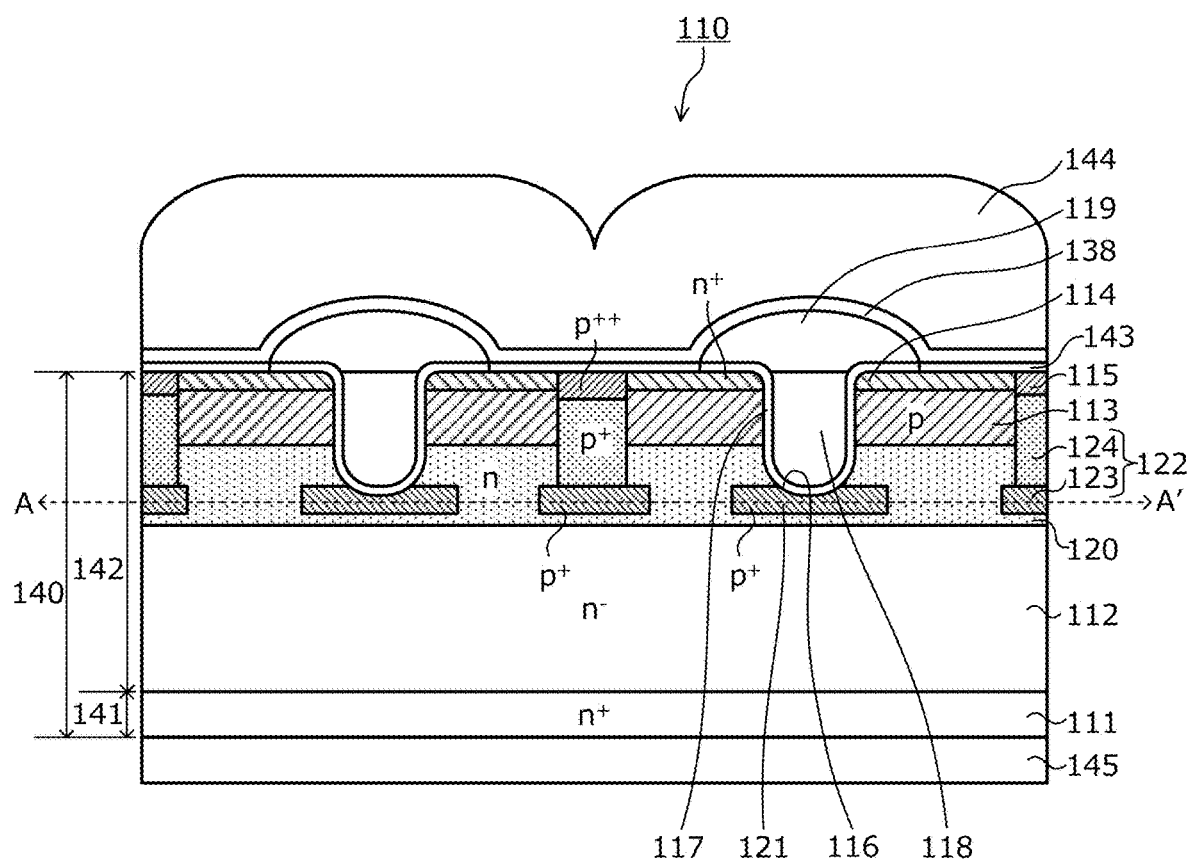
FIG. 14 is a cross-sectional view of a structure of a conventional silicon carbide semiconductor device along cutting line A-A' in FIG. 16.
Figure 15:
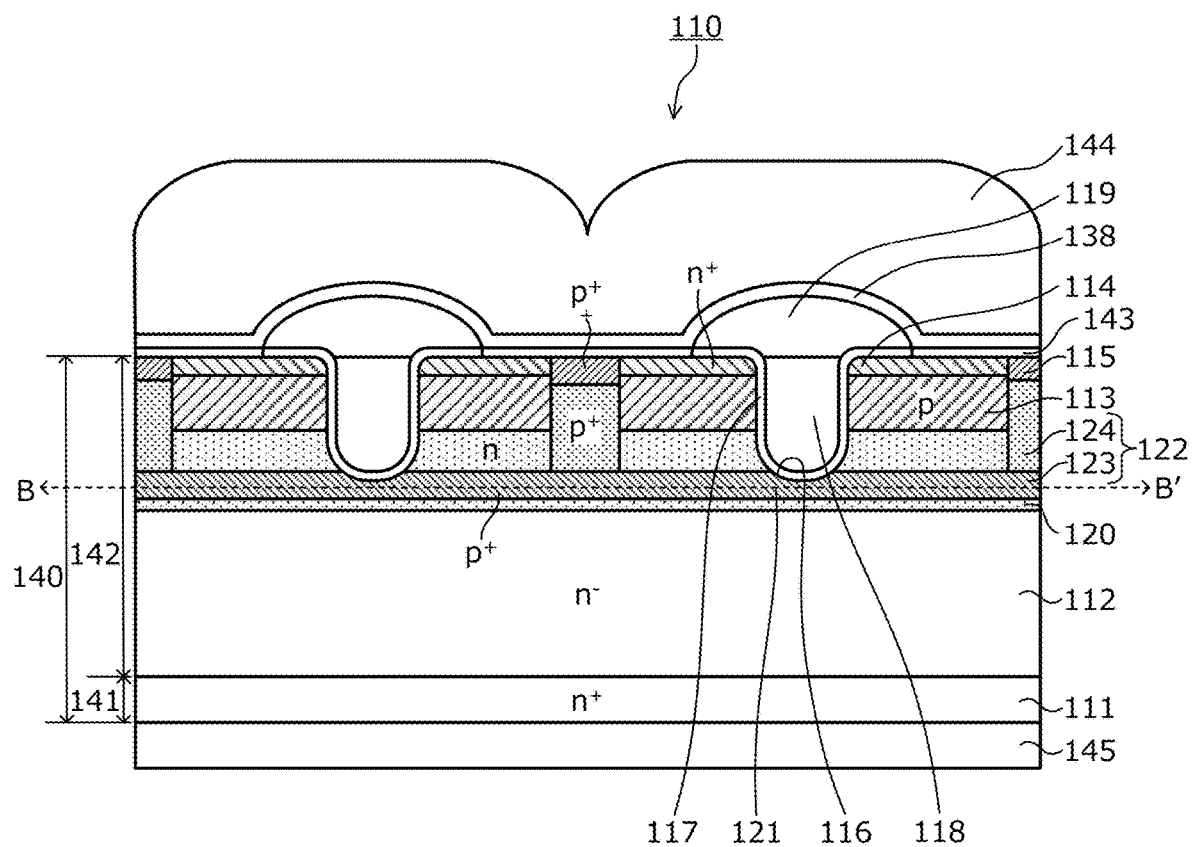
FIG. 15 is a cross-sectional view of the structure of the conventional silicon carbide semiconductor device along cutting line B-B' in FIG. 16.
Figure 16:
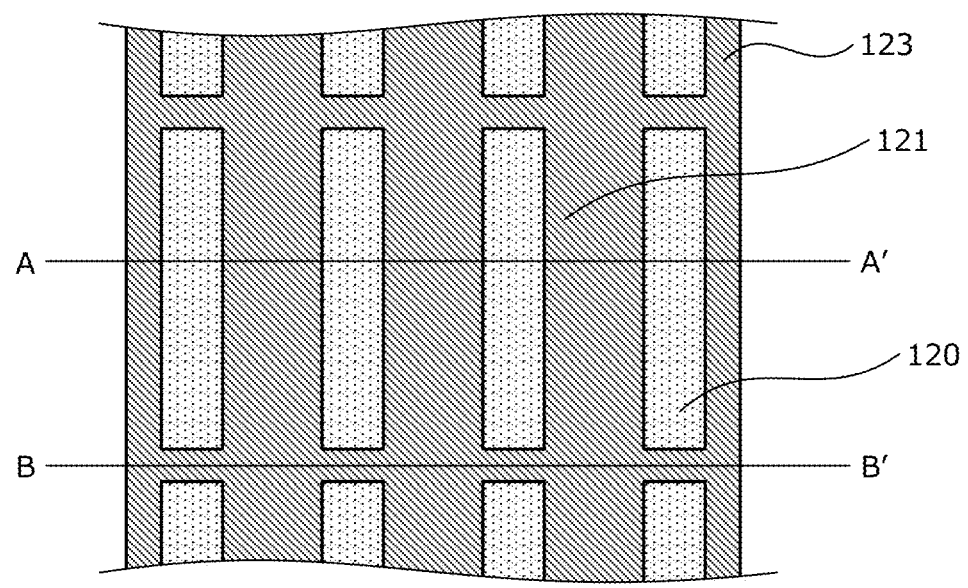
FIG. 16 is a plan view depicting the structure of the conventional silicon carbide semiconductor device.

As described, in the present invention, without the p$^+$-type regions (the p$^+$-type regions 122 of the conventional structure, refer to FIGS. 14 and 15) between the trenches 16 that are at the same depth as that of the p$^+$-type regions 21, the number of JFET structures (structures of a portion through which current passes between the trenches 16) per cell is consolidated into one. Furthermore, connection of the p$^+$-type regions 21 and the p$^{++}$-type contact regions 15 is realized by fabricating the p$^+$-type regions 22 deeply, centered between (in a center between) any adjacent two of the trenches 16.

Figure 3B:
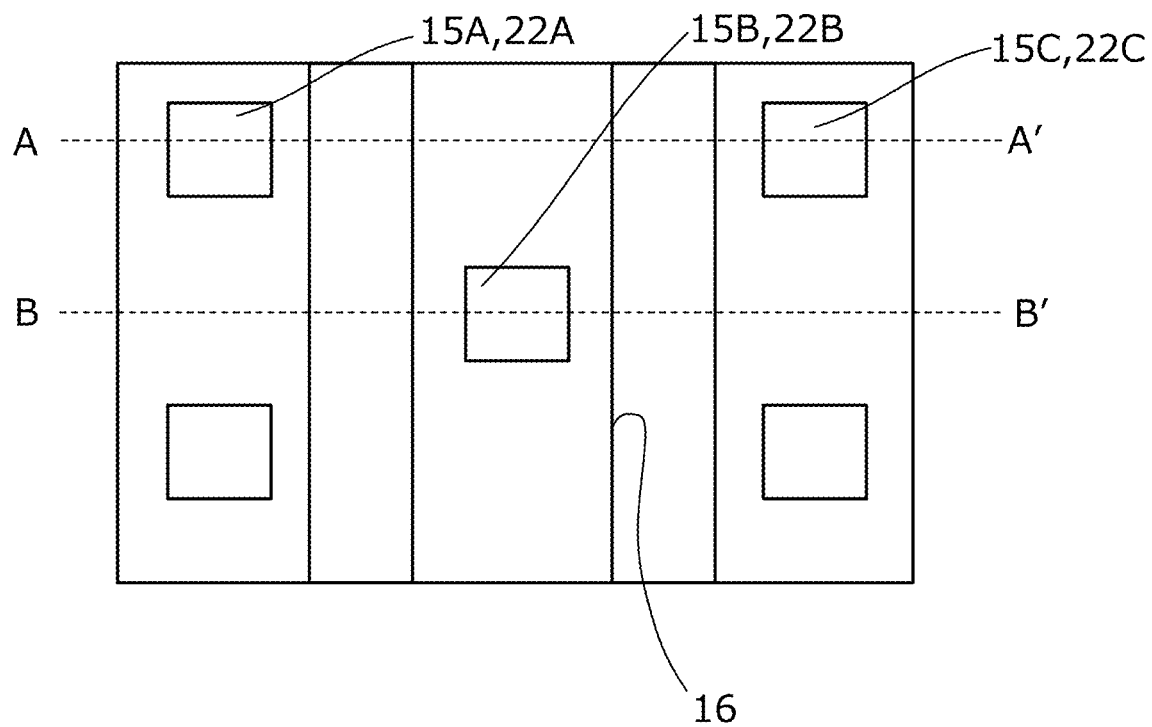
FIG. 3B is a top view of an instance in which in the silicon carbide semiconductor device according to the first embodiment, $p^+$-type regions and $p^{++}$-type contact regions are disposed alternating one another.

In FIG. 3A, while only one of the p$^{++}$-type contact regions 15 is depicted between the trenches 16, the p$^{++}$-type contact regions 15 are disposed in periodically in the longitudinal direction of the trenches 16, in a striped pattern while the p$^+$-type regions 22 are disposed periodically in a striped pattern in regions in which the p$^{++}$-type contact regions 15 are disposed. In FIG. 3A, in a cross-section along cutting line B-B', while the p$^+$-type regions 22 and the p$^{++}$-type contact regions 15 are disposed, arrangement may be alternating one another. FIG. 3B is a top view of an instance in which in the silicon carbide semiconductor device according to the first embodiment, the p$^+$-type regions and the p$^{++}$-type contact regions are disposed alternating one another. As depicted in FIG. 3B, p$^+$-type regions 22B and p$^{++}$-type contact regions 15B may be disposed between the trenches 16 in the cross-section along cutting line B-B', while p$^+$-type regions 22A, C and p$^{++}$-type contact regions 15A, C may be disposed between the trenches 16 in the cross-section along cutting line A-A'.

For example, a width L1 of each of the p$^+$-type regions 21 is in a range of 1.1 to 2.3 µm; a distance L2 between the p$^+$-type regions 21 is in a range of 0.3 to 1.5 µm; and a distance L3 between the upper surface of one of the p$^+$-type regions 21 and the lower surface of one of the p-type base regions 13 is in a range of 0.1 to 0.5 µm. Further, a thickness L4 of each of the p-type base regions 13 is in a range of 0.2 to 0.5 µm and a thickness of each of L5 the n$^+$-type source regions 14 is in a range of 0.1 to 0.5 µm. A cell pitch L6 (distance from the center between any adjacent two of the trenches 16 (center of any mesa region) to the center between another adjacent two of the trenches 16, adjacent thereto (center of an adjacent mesa region)) is about 2.6 µm. Further, a width L7 of each of the p$^+$-type regions 22 is in a range of 1.0 to 1.6 µm; a length L8 of each of the p$^+$-type regions 22 in a longitudinal direction is in a range of 0.8 to 4.5 μm; and an interval L9 of the $p^+$-type regions 22, in the longitudinal direction is 1.0 μm or greater.

Further, in FIG. 3A, while the $p^+$-type regions 22 and the $p^{++}$-type contact regions 15 have a rectangular cube-shape, the $p^+$-type regions 22 and the $p^{++}$-type contact regions 15 may have a cylindrical shape. The cylindrical shape may prevent an instance in which channel-forming regions are not formed due to positions of the $p^+$-type regions 22 and the $p^{++}$-type contact regions 15 being shifted. Herein, while the $p^+$-type regions 22 and the $p^{++}$-type contact regions 15 are apart from the trenches 16, the $p^+$-type regions 22 and the $p^{++}$-type contact regions 15 may be in contact with the trenches 16.

As described, the structure per cell is simplified, whereby the cell pitch may be reduced and by reducing the cell pitch, reductions in the resistance of the SiC MOSFET in which channel mobility is low may be realized. Furthermore, some leeway in the structure between the trenches 16 is achieved and as compared to the conventional structure, the width of the $p^+$-type regions 21, which are beneath the trenches 16 may be increased and by widening flat portions of the pn junctions, concentration of electric field is mitigated, and the breakdown voltage may be increased. For example, the width L1 of the $p^+$-type regions 21 may be greater than a width of the JFET region, that is, the distance L2 between any adjacent two of the $p^+$-type regions 21. In this instance, a path Lj (distance from the lower surfaces of the p-type base regions 13 to the lower surfaces of the $p^+$-type regions 21) of the JFET through which current passes increases, whereby saturated current is suppressed and short-circuit resistance capability is enhanced.

In FIGS. 2 and 3A, while the p-type regions that connect the $p^+$-type regions 21 and the source electrode 44 to each other have a two-layer structure including the $p^+$-type regions 22 and the $p^{++}$-type contact regions 15, the structure may be a single layer. In this instance, configuration may be such that only the $p^+$-type regions 22 are provided connecting the $p^+$-type regions 21 and the source electrode 44 to each other or only the $p^{++}$-type contact regions 15 is provided connecting the $p^+$-type regions 21 and the source electrode 44 to each other.

Figure 10:
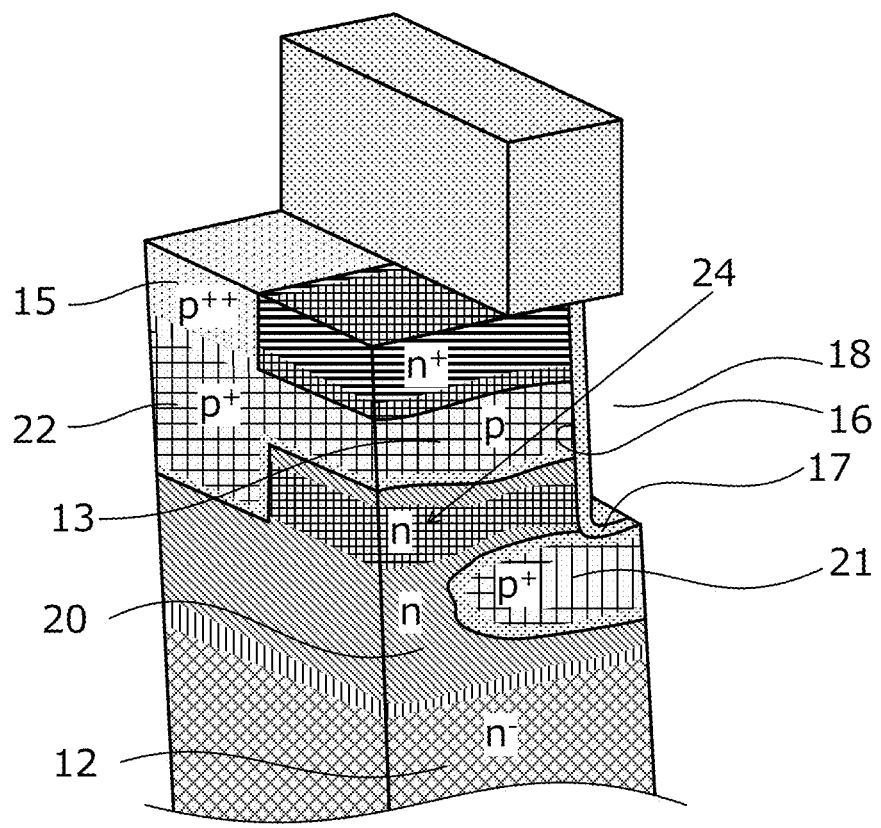
FIG. 10 is a perspective view depicting impurity concentration distribution of the silicon carbide semiconductor device according to the first embodiment.
Figure 11:
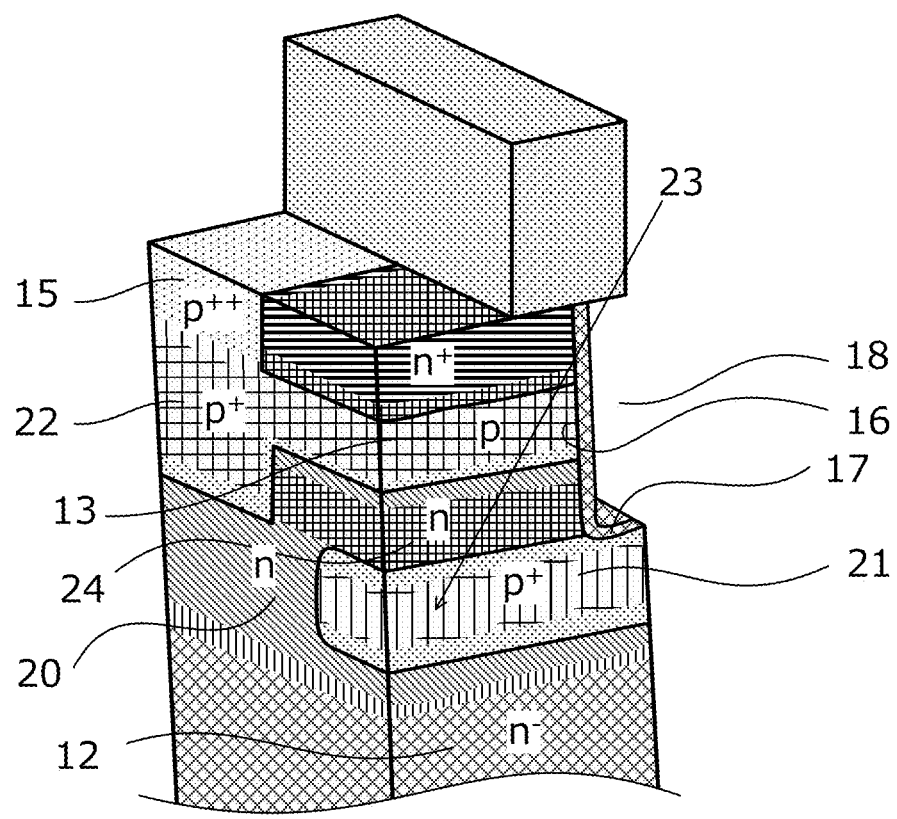
FIG. 11 is a perspective view depicting impurity concentration distribution of the silicon carbide semiconductor device according to the second embodiment.

Further, a peak value of the impurity concentration of the $p^+$-type regions 21 in the depth direction may occur in a center portion of each of the $p^+$-type regions 21 (refer to FIGS. 10 and 11). In this instance, the bottoms of the trenches 16 are provided closer to the source electrode 44 than are positions where the impurity concentration of each of the $p^+$-type regions 21 peaks (is maximal). By this configuration, when a depletion layer spreads, electric field strength peaks at a portion closer to the back surface of the semiconductor substrate 40 than are the center portions of the $p^+$-type regions 21. In other words, the electric field strength may be caused to peak away from the gate insulating films 17. Thus, a maximum peak value of the electric field strength may be lowered, thereby enabling the breakdown voltage to be increased.

The trenches 16 penetrate through the $n^+$-type source regions 14 and the p-type base regions 13 in the depth direction and reach the n-type current spreading region 20 (in an instance in which the n-type current spreading region 20 is omitted, the $n^-$-type drift region 12). The trenches 16 may terminate in the $p^+$-type regions 21. The trenches 16, for example, extend in a striped pattern in a direction parallel to the front surface of the semiconductor substrate 40 and reach an outer peripheral portion (not depicted) of the active region. In the trenches 16, the gate electrodes 18 are provided, respectively, via the gate insulating films 17.

An interlayer insulating film 19 is provided in an entire area of the front surface of the semiconductor substrate 40 and covers the gate electrodes 18. The ohmic electrodes (first electrodes) 43 are provided in contact holes of the interlayer insulating film 19, on portions of the front surface of the semiconductor substrate 40 exposed by the contact holes. The ohmic electrodes 43 are in ohmic contact with the $n^+$-type source regions 14 and the $p^{++}$-type contact regions 15 at the front surface of the semiconductor substrate 40, in the contact holes of the interlayer insulating film 19. The ohmic electrodes 43, for example, are a nickel silicide (NixSiy, where, x, y are arbitrary integers.

The source electrode (first electrode) 44 is provided on the interlayer insulating film 19 so as to be embedded in the contact holes of the interlayer insulating film 19. The source electrode 44 is provided in an entire area of a center portion of the active region; the source electrode 44 is electrically connected to the $n^+$-type source regions 14, the $p^{++}$-type contact regions 15, the p-type base regions 13, and the $p^+$-type regions 21, 22 via the ohmic electrodes 43.

On the ohmic electrodes 43 and the interlayer insulating film 19, a barrier metal 38 that prevents diffusion of metal atoms to the gate electrodes 18 may be provided. The barrier metal 38, for example, contains titanium (Ti) or titanium nitride (TiN). The barrier metal 38 may have a two-layer structure of Ti and TiN where Ti is relatively closer to the semiconductor substrate 40. In this instance, the source electrode 44 is provided on the barrier metal 38.

A drain electrode (second electrode) 45 is provided in an entire area of the back surface of the semiconductor substrate 40 (the back surface of the $n^+$-type starting substrate 41), is in ohmic contact with the $n^+$-type drain region 11 (the $n^+$-type starting substrate 41), and is electrically connected to the $n^+$-type drain region 11.

Figure 4:
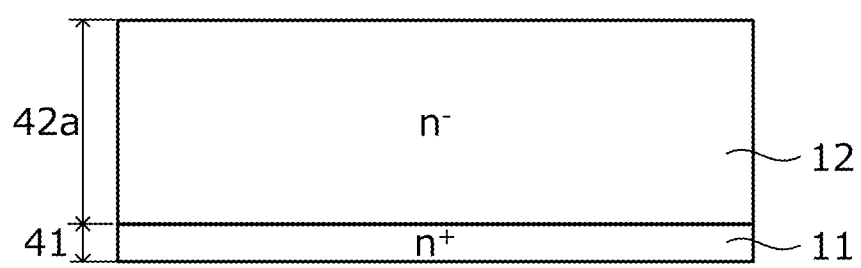
FIG. 4 is a cross-sectional view depicting a state of the silicon carbide semiconductor device according to the first embodiment during manufacture.

Next, a method of manufacturing the silicon carbide semiconductor device according to the first embodiment is described. FIGS. 4, 5, 6, and 7 are cross-sectional views depicting states of the silicon carbide semiconductor device according to the first embodiment during manufacture. First, at the front surface of the $n^+$-type starting substrate ($n^+$-type starting wafer) 41, an $n^-$-type silicon carbide layer 42a constituting the $n^-$-type drift region 12 is epitaxially grown. The state up to here is depicted in FIG. 4. Next, a lower portion of the n-type current spreading region 20 is formed in the $n^-$-type silicon carbide layer 42a by ion-implantation of an n-type impurity. Next, in the $n^-$-type silicon carbide layer 42a, at the surface thereof, the $p^+$-type regions 21 are selectively formed by photolithography and ion-implantation of a p-type impurity.

Figure 5:
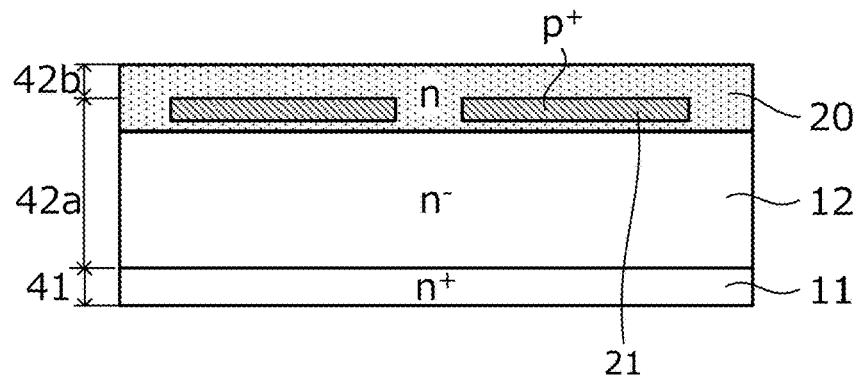
FIG. 5 is a cross-sectional view depicting a state of the silicon carbide semiconductor device according to the first embodiment during manufacture.

Next, on the $n^-$-type silicon carbide layer 42a, an $n^-$-type silicon carbide layer 42b constituting the $n^-$-type drift region 12 is epitaxially grown. Next, an upper portion of the n-type current spreading region 20 is formed in the $n^-$-type silicon carbide layer 42b by ion-implantation of an n-type impurity. The state up to here is depicted in FIG. 5. Next, on the $n^-$-type silicon carbide layer 42b, an $n^-$-type silicon carbide layer 42c constituting the $n^-$-type drift region 12 is epitaxially grown. By the processes up to here, the semiconductor substrate (semiconductor wafer) 40 having a predetermined thickness and in which the $n^-$-type silicon carbide layer 42 (42a, 42b, and 42c) is stacked on the $n^+$-type starting substrate 41 is completed.

Figure 6:
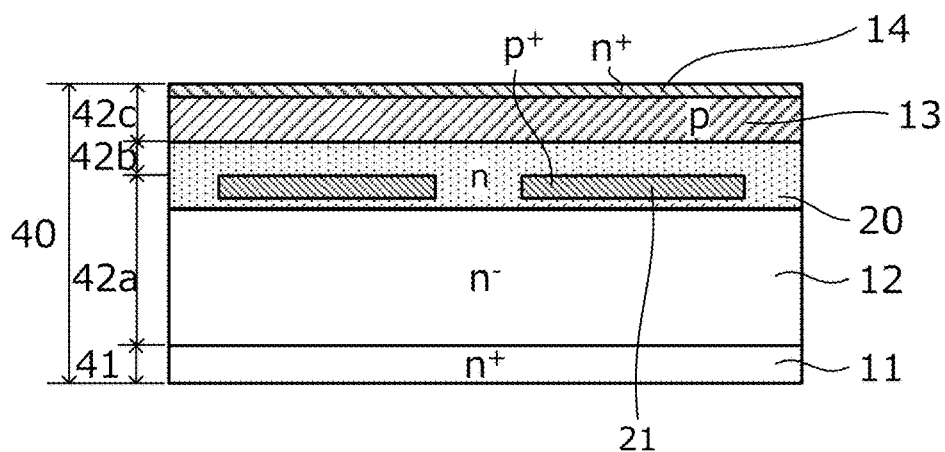
FIG. 6 is a cross-sectional view depicting a state of the silicon carbide semiconductor device according to the first embodiment during manufacture.

Next, by photolithography and ion-implantation of a p-type impurity, the p-type base regions 13 are formed in the $n^-$-type silicon carbide layer 42c. Next, in the $n^-$-type silicon carbide layer 42c, at the surface thereof, the n$^+$-type source regions 14 are selectively formed by photolithography and ion-implantation of an n-type impurity. The state up to here is depicted in FIG. 6.

Figure 7:
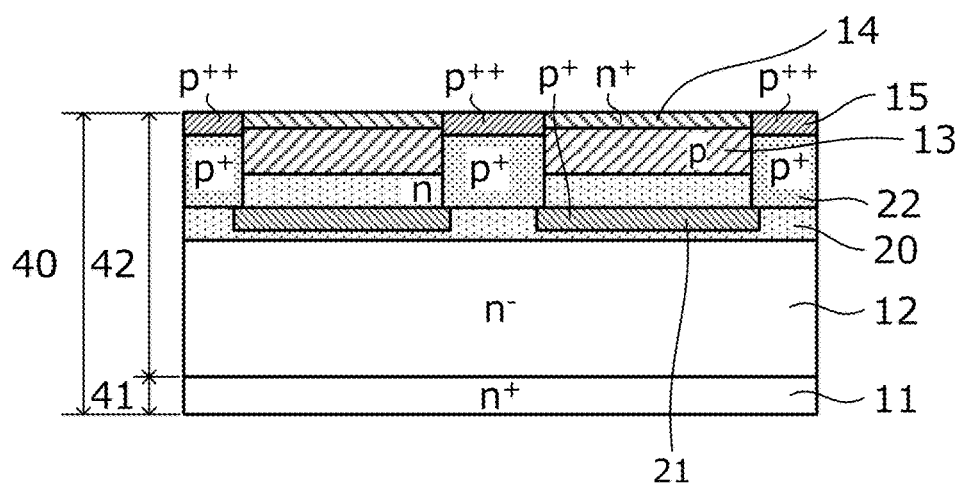
FIG. 7 is a cross-sectional view depicting a state of the silicon carbide semiconductor device according to the first embodiment during manufacture.

Next, the p$^+$-type regions 22 are formed in the n$^-$-type silicon carbide layer 42b and the n$^-$-type silicon carbide layer 42c by photolithography and ion-implantation of a p-type impurity so that the lower surfaces of the p$^+$-type regions 22 are in contact with the p$^+$-type regions 21. Next, in the n$^-$-type silicon carbide layer 42c, at the surface thereof, the p$^{++}$-type contact regions 15 are selectively formed by photolithography and ion-implantation of a p-type impurity. The state up to here is depicted in FIG. 7. As described, the p$^+$-type regions 22 are formed deeply, whereby the p$^{++}$-type contact regions 15 and the p$^+$-type regions 21 beneath the trenches 16 are connected to one another. The p$^+$-type regions 22 and the p$^{++}$-type contact regions 15 may be formed at the same process of photolithography and ion-implantation of a p-type impurity and thus, cost may be reduced by eliminating the conventionally required process of forming p$^+$-type regions between the p$^+$-type regions 21.

Herein, while the p$^+$-type regions 22 are formed by a single session of ion implantation, the p$^+$-type regions 22 may be formed by multiple sessions of ion implantation. For example, after formation of the n$^-$-type silicon carbide layer 42b, lower regions of the p$^+$-type regions 22 may be formed, and after formation of the n$^-$-type silicon carbide layer 42c, upper regions of the p$^+$-type regions 22 may be formed. Further, in the n$^-$-type silicon carbide layer 42c, at the surface thereof, the p$^+$-type regions 22 are formed and by ion-implanting a p-type impurity in the p$^+$-type regions 22, at the surfaces thereof, the p$^{++}$-type contact regions 15 may be formed. Further, the p-type base regions 13 and/or the n$^+$-type source regions 14 may be formed by epitaxial growth, while the p$^+$-type regions 22 and the p$^{++}$-type contact regions 15 are formed by ion implantation.

A portion of the n$^-$-type silicon carbide layer 42 (42a to 42c) free of ion implantation and having the impurity concentration at the time of epitaxial growth constitutes the n$^-$-type drift region 12. Next, a heat treatment for activating the impurities ion-implanted in the silicon carbide layer 42 is performed. The heat treatment for activating the impurities may be performed for each ion-implantation of an impurity in the silicon carbide layers 42a to 42c. Next, by a general method, the trenches 16, the gate insulating films 17, and the gate electrodes 18 are formed.

Next, the interlayer insulating film 19 is formed in an entire area of the front surface of the semiconductor substrate 40. Next, by a general method, the source electrode 44, a gate pad (not depicted), a passivation film (surface protecting film: not depicted), and the drain electrode 45 are formed. A portion of the source electrode 44 exposed in an opening of the passivation film constitutes a source pad. Subsequently, the semiconductor wafer is diced (cut) into individual chips, whereby the silicon carbide semiconductor device 10 depicted in FIGS. 1 to 3A is completed.

As described above, according to the silicon carbide semiconductor device of the first embodiment, the conventional p$^+$-type regions between the trenches and provided at the same depth as that of the p$^+$-type regions beneath the trenches are eliminated, instead p$^+$-type regions having lower surfaces in contact with a portion of the upper surfaces of the p$^+$-type regions beneath the trenches and upper surfaces in contact with the p$^{++}$-type contact regions are provided thereby connecting the p$^+$-type regions beneath the trenches and the p$^{++}$-type contact regions. As a result, the structure per cell is simplified thereby enabling reduction of the cell pitch and realization of reductions in the resistance of the SiC MOSFET in which channel mobility is low. Furthermore, the width of the p$^+$-type regions beneath the trenches may be increased, whereby flat portions of the pn junctions become wider, thereby enabling increased mitigation of electric field concentration and increased breakdown voltage. Widening of the p$^+$-type regions increases the length of the JFET path through which current passes, whereby saturated current is suppressed and short-circuit resistance capability is enhanced.

Figure 8:
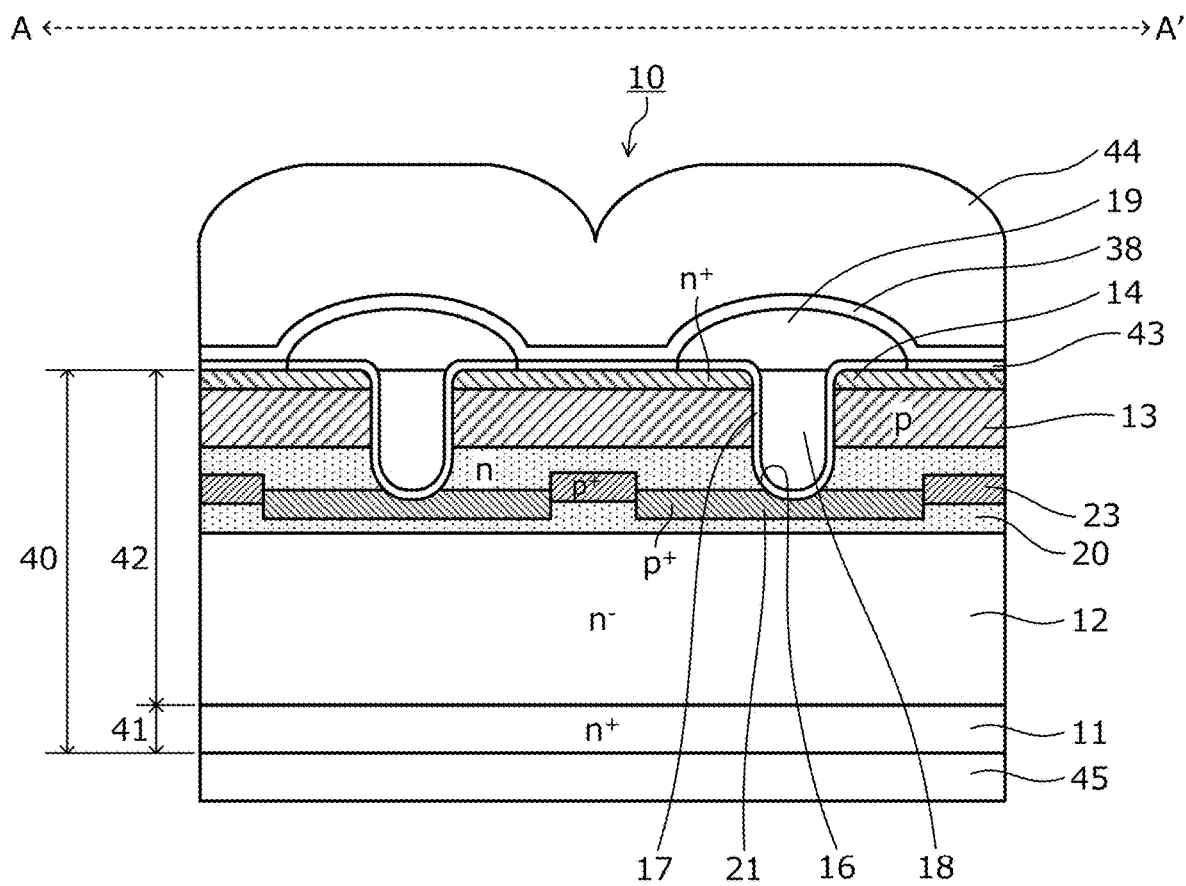
FIG. 8 is a cross-sectional view along cutting line A-A' in FIG. 9 depicting a structure of a silicon carbide semiconductor device according to a second embodiment.
Figure 9:
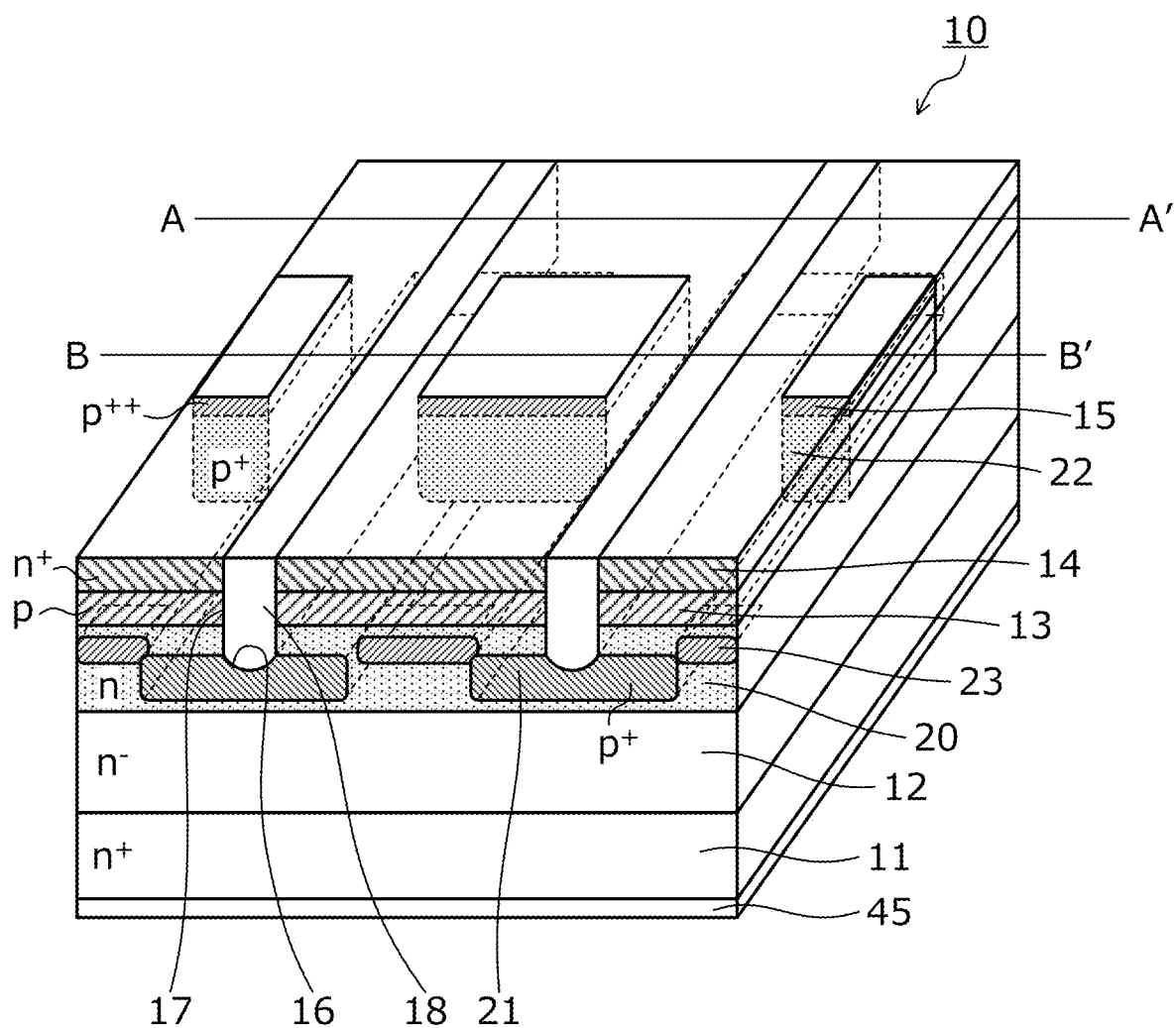
FIG. 9 is a perspective view depicting the structure of the silicon carbide semiconductor device according to the second embodiment.

Next, a structure of a silicon carbide semiconductor device according to a second embodiment is described. FIG. 8 is a cross-sectional view along cutting line A-A' in FIG. 9 depicting the structure of the silicon carbide semiconductor device according to the second embodiment. FIG. 9 is a perspective view depicting the structure of the silicon carbide semiconductor device according to the second embodiment. A cross-sectional view along cutting line B-B' in FIG. 9 is identical to that of the first embodiment and thus, is not depicted hereinafter (refer to FIG. 2).

In the silicon carbide semiconductor device according to the second embodiment, p$^+$-type protective regions (third high-concentration regions of the second conductivity type) 23 are selectively provided in a region free of the p$^+$-type regions 22 and the p$^{++}$-type contact regions 15. Each of the p$^+$-type protective regions 23 electrically connects the p$^+$-type regions 21 adjacent thereto and has about the same impurity concentration as that of the p$^+$-type regions 21. The p$^+$-type protective regions 23, for example, as depicted in FIGS. 8 and 9, have about the same thickness as that of the p$^+$-type regions 21 and are provided at shallower positions (closer to the front surface of the semiconductor substrate 40) than are the p$^+$-type regions 21; and a portion of each of the side surfaces of the p$^+$-type protective regions 23 is in contact with a portion of each of the side surfaces of the p$^+$-type regions 21. Further, the p$^+$-type protective regions 23 may have about the same thickness as that of the p$^+$-type regions 21 and may be provided at the same depth as that of the p$^+$-type regions 21.

FIG. 10 is a perspective view depicting impurity concentration distribution of the silicon carbide semiconductor device according to the first embodiment. FIG. 11 is a perspective view depicting impurity concentration distribution of the silicon carbide semiconductor device according to the second embodiment. In the silicon carbide semiconductor device according to the first embodiment, as depicted in FIG. 10, in a region free of the p$^+$-type regions 22 and the p$^{++}$-type contact regions 15, a JFET region 24 having a wide width is provided. In this instance, punch-through tends to occur at the thin p-type base regions 13 directly above the JFET region 24 having a wide width and the breakdown voltage may decrease. Therefore, in the second embodiment, as depicted in FIG. 11, the p$^+$-type protective regions 23 that are in contact with the p$^+$-type regions 21 are provided, whereby decreases in the breakdown voltage are circumvented. FIG. 11 depicts an instance in which the p$^+$-type protective regions 23 have about the same thickness as that of the p$^+$-type regions 21 and are provided at the same depth as that of the p$^+$-type regions 21. Further, as depicted in FIG. 11, similarly to the p$^+$-type regions 21, the peak of the impurity concentration of the p$^+$-type protective regions 23 may be in the center portion.

Next, a method of manufacturing the silicon carbide semiconductor device according to the second embodiment is described. The silicon carbide semiconductor device according to the second embodiment may be manufactured by selectively forming in the n⁻-type silicon carbide layer 42b, at the surface thereof, the p⁺-type protective regions 23 by photolithography and ion-implantation of a p-type impurity, after epitaxially growing the n⁻-type silicon carbide layer 42b (refer to FIG. 5) in the method of manufacturing the silicon carbide semiconductor device according to the first embodiment.

As described above, according to the silicon carbide semiconductor device of the second embodiment, effects similar to those of the first embodiment are obtained. Furthermore, in the region free of the p⁺-type regions and the p⁺⁺-type contact regions, the p⁺-type protective regions connecting the p⁺-type regions that are beneath the trenches are selectively provided. As a result, punch-through at the thin p-type base regions directly above is prevented and decreases in the breakdown voltage may be circumvented.

Figure 12:
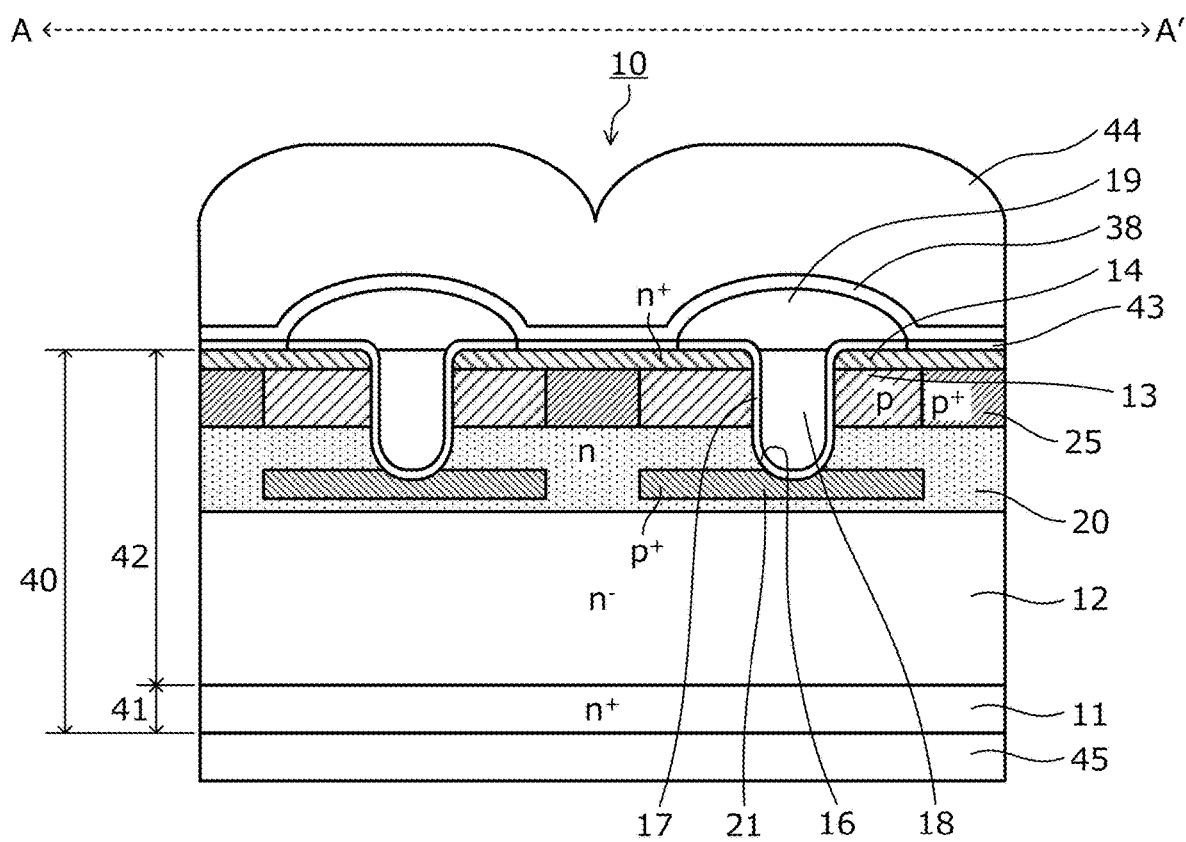
FIG. 12 is cross-sectional view depicting a structure of a silicon carbide semiconductor device according to a third embodiment.

Next, a structure of a silicon carbide semiconductor device according to a third embodiment is described. FIG. 12 is cross-sectional view depicting the structure of the silicon carbide semiconductor device according to the third embodiment. In the third embodiment, a perspective view is substantially the same as that of the first embodiment and thus, is not depicted hereinafter (refer to FIG. 3A). FIG. 12 is cross-sectional view corresponding to a cross-section along cutting line A-A' in FIG. 1. A cross-sectional view corresponding to a cross-section along cutting line B-B' is the same as that of the first embodiment and thus, is not depicted hereinafter (refer to FIG. 2).

In the silicon carbide semiconductor device according to the third embodiment, in the p-type base regions 13 on regions free of the p⁺-type regions 22 and the p⁺⁺-type contact regions 15, high-concentration p⁺-type base regions (fourth high-concentration regions of the second conductivity type)25 are selectively provided. The high-concentration p⁺-type base regions 25 have an impurity concentration that is about two times higher than that of the p-type base regions 13, have a width that is equal to the width of the JFET region, i.e., is about the same as the distance L2 between any adjacent two of the p⁺-type regions 21, and have a thickness that is about the same as that of the p-type base regions 13. The high-concentration p⁺-type base regions 25 may be thicker than the p-type base regions 13.

Figure 13:
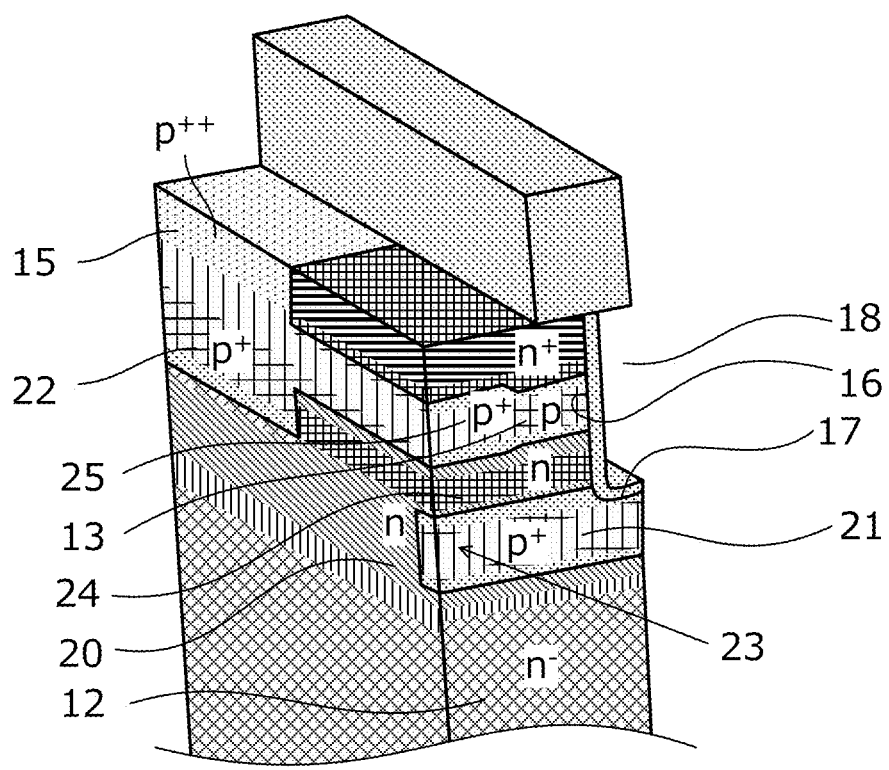
FIG. 13 is a perspective view depicting impurity concentration distribution of the silicon carbide semiconductor device according to the third embodiment.

FIG. 13 is a perspective view depicting impurity concentration distribution of the silicon carbide semiconductor device according to the third embodiment. The silicon carbide semiconductor device according to the third embodiment may have the p⁺-type protective regions 23, similarly to the silicon carbide semiconductor device according to the second embodiment. FIG. 13 depicts impurity concentration distribution in an instance in which the p⁺-type protective regions 23 are provided similarly to the high-concentration p⁺-type base regions 25. In the silicon carbide semiconductor device according to the first embodiment, as depicted in FIG. 10, in a region free of the p⁺-type regions 22 and the p⁺⁺-type contact regions 15, the JFET region 24 having a wide width is provided. In this instance, punch-through tends to occur at the thin p-type base regions 13 directly on the JFET region 24, which has a wide width, and breakdown voltage may decrease. Therefore, in the third embodiment, as depicted in FIG. 13, the high-concentration p⁺-type base regions 25 having an increased impurity concentration are provided in the p-type base regions 13 that are directly on the JFET region 24, whereby decreases in breakdown voltage are circumvented without degradation of characteristics of the silicon carbide semiconductor device.

Next, a method of manufacturing the silicon carbide semiconductor device according to the third embodiment is described. The silicon carbide semiconductor device according to the third embodiment may be manufactured by selectively forming the high-concentration p⁺-type base regions 25 by increasing the impurity concentration of a portion of each of the p-type base regions 13 by photolithography and ion-implantation of a p-type impurity, after forming the p-type base regions 13 (refer to FIG. 6) in the n⁻-type silicon carbide layer 42c, in the method of manufacturing the silicon carbide semiconductor device according to the first embodiment.

As described above, according to the silicon carbide semiconductor device of the third embodiment, effects similar to those of the first embodiment are obtained. Furthermore, the high-concentration p⁺-type base regions 25 are selectively provided in the p-type base regions on the regions free of the p⁺-type regions and the p⁺⁺-type contact regions. As a result, punch-through at the thin p-type base regions 13 directly above is prevented and decreases in the breakdown voltage are circumvented.

In the foregoing, the present invention may be variously modified within a range not departing from the spirit of the invention and in the embodiments described above, for example, dimensions, impurity concentrations, etc. of regions may be variously set according to necessary specifications. Further, in the embodiments described above, while a MOSFET having a trench structure is described as an example, application is further possible to other semiconductor devices a trench structure, IGBTs, etc.

According to the invention described above, the conventional p⁺-type regions between the trenches and provided at the same depth as that of the p⁺-type regions (first high-concentration regions of the second conductivity type) beneath the trenches are eliminated, instead p⁺-type regions (lower second high-concentration regions) having lower surfaces in contact with portions of the upper surfaces of the p⁺-type regions and having upper surfaces in contact with the p⁺⁺-type contact regions (upper second high-concentration regions) are provided thereby connecting the p⁺-type regions and the p⁺⁺-type contact regions. As a result, the structure per cell is simplified enabling reduction of the cell pitch and realization of reductions in the resistance of the SiC MOSFET in which channel mobility is low. Furthermore, the width of the p⁺-type regions beneath the trenches may be increased, whereby flat portions of the pn junctions become wider, thereby enabling increased mitigation of electric field concentration and increased breakdown voltage. Widening of the p⁺-type regions increases the length of the JFET path through which current passes, whereby saturated current is suppressed and short-circuit resistance capability is enhanced.

The silicon carbide semiconductor device and the method of manufacturing a silicon carbide semiconductor device according to the present invention may realize reductions in cells pitch, increases in breakdown voltage, and reductions in resistance.

As described above, the silicon carbide semiconductor device and the method of manufacturing a silicon carbide semiconductor device according to the present invention are useful for power semiconductor devices used in power converting equipment such as inverters, power source devices such as those in various types of industrial machines, igniters of automobiles, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of a first conductivity type, having a first main surface and a second main surface opposite to each other;
a first semiconductor layer of the first conductivity type, provided at the first main surface of the silicon carbide semiconductor substrate, the first semiconductor layer having an impurity concentration that is lower than an impurity concentration of the silicon carbide semiconductor substrate, the first semiconductor layer having a first surface and a second surface opposite to each other, the second surface facing the silicon carbide semiconductor substrate;
a second semiconductor layer of a second conductivity type, provided at the first surface of the first semiconductor layer, the second semiconductor layer having a first surface and a second surface opposite to each other, the second surface facing the first semiconductor layer;
a plurality of first semiconductor regions of the first conductivity type, selectively provided in the second semiconductor layer at the first surface thereof;
a plurality of trenches penetrating through respective ones of the plurality of first semiconductor regions and the second semiconductor layer and reaching the first semiconductor layer;
a plurality of gate electrodes, each provided in a corresponding one of the plurality of trenches, via a gate insulating film;
a plurality of first high-concentration regions of the second conductivity type provided in the first semiconductor layer at positions facing respective ones of the plurality of trenches in a depth direction of the silicon carbide semiconductor device;
a plurality of second high-concentration regions of the second conductivity type, each selectively provided in the second semiconductor layer and the first semiconductor layer between a corresponding adjacent two of the plurality of trenches, each of the plurality of second high-concentration regions being in contact with a corresponding one of the plurality of first semiconductor regions, each of the plurality of second high-concentration regions having an upper surface exposed from the first surface of the second semiconductor layer and a lower surface partially in contact with upper surfaces of a corresponding adjacent two of the plurality of first high-concentration regions;
a first electrode provided on surfaces of the plurality of second high-concentration regions and the plurality of first semiconductor regions; and
a second electrode provided on the second main surface of the silicon carbide semiconductor substrate, wherein
the plurality of second high-concentration regions is disposed periodically in a longitudinal direction of the trenches.

2. The silicon carbide semiconductor device according to claim 1, wherein
each of the plurality of second high-concentration regions is configured by an upper second high-concentration region facing the first electrode and a lower second high-concentration region facing the second electrode, the upper second high-concentration region having an impurity concentration that is higher than an impurity concentration of the lower second high-concentration region.

3. The silicon carbide semiconductor device according to claim 1, wherein
a width of each of the plurality of second high-concentration regions is greater than a distance between any adjacent two of the plurality of first high-concentration regions.

4. The silicon carbide semiconductor device according to claim 1, wherein
each of the plurality of second high-concentration regions is spaced apart from the plurality of trenches.

5. The silicon carbide semiconductor device according to claim 1, wherein
each of the plurality of first high-concentration regions is in contact with a bottom of a respective one of the plurality of trenches, and has an impurity concentration distribution, a peak of which is located at a center of each of the plurality of first high-concentration regions, and
the bottom of each of the plurality of trenches is provided closer to the first electrode than is a position where the peak of the impurity concentration distribution is located.

6. The silicon carbide semiconductor device according to claim 1, further comprising
a plurality of third high-concentration regions of the second conductivity type, selectively provided in a region free of the plurality of second high-concentration regions, each of the plurality of third high-concentration region connecting to each other a corresponding adjacent two of the plurality of first high-concentration regions.

7. The silicon carbide semiconductor device according to claim 1, further comprising a plurality of fourth high-concentration regions of the second conductivity type, each of the plurality of fourth high-concentration regions:
being selectively provided in the first semiconductor layer at the first surface of the first semiconductor layer between a corresponding adjacent two of the plurality of first high-concentration regions in a region free of the plurality of second high-concentration regions, and
having an impurity concentration that is higher than an impurity concentration of the second semiconductor layer.

8. A method of manufacturing a silicon carbide semiconductor device, the method comprising:
preparing a silicon carbide semiconductor substrate of a first conductivity type, having a first main surface and a second main surface opposite to each other;
forming a first semiconductor layer of the first conductivity type at the first main surface of the silicon carbide semiconductor substrate, the first semiconductor layer having an impurity concentration that is lower than an impurity concentration of the silicon carbide semiconductor substrate, the first semiconductor layer having a first surface and a second surface opposite to each other, the second surface facing the silicon carbide semiconductor substrate;
forming a second semiconductor layer of a second conductivity type at the first surface of the first semiconductor layer, the second semiconductor layer having a first surface and a second surface opposite to each other, the second surface facing the first semiconductor layer;

forming a plurality of first high-concentration regions of the second conductivity type in the first semiconductor layer;

selectively forming a plurality of second high-concentration regions of the second conductivity type in the first semiconductor layer and the second semiconductor layer, each of the plurality of second high-concentration regions having
- an upper surface exposed from the first surface of the second semiconductor layer, and
- a lower surface partially in contact with upper surfaces of the plurality of first high-concentration regions;

selectively forming a plurality of first semiconductor regions of the first conductivity type in the second semiconductor layer at the first surface thereof;

forming a plurality of trenches penetrating through respective ones of the plurality of first semiconductor regions and the second semiconductor layer and reaching the first semiconductor layer;

forming a plurality of gate electrodes, each gate electrode being embedded in a corresponding one of the plurality of trenches, via a gate insulating film;

forming a first electrode at surfaces of the plurality of second high-concentration regions and the plurality of first semiconductor regions; and forming a second electrode at the second main surface of the silicon carbide semiconductor substrate, wherein each of the plurality of first high-concentration regions faces a corresponding one of the plurality of trenches in a depth direction of the silicon carbide semiconductor device, and each of the plurality of second high-concentration regions is in contact with a corresponding one of the plurality of first semiconductor regions and is formed periodically in a longitudinal direction of the plurality of trenches between a corresponding adjacent two of the plurality of trenches.

* * * * *